United States Patent
Dhayni

(10) Patent No.: US 9,344,302 B2
(45) Date of Patent: May 17, 2016

(54) LOOPBACK TECHNIQUE FOR IQ IMBALANCE ESTIMATION FOR CALIBRATION IN OFDM SYSTEMS

(71) Applicant: ST-Ericsson SA, Plan-les-Ouates (CH)

(72) Inventor: Achraf Dhayni, Vallauris (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/423,757

(22) PCT Filed: Sep. 10, 2013

(86) PCT No.: PCT/EP2013/068767
§ 371 (c)(1),
(2) Date: Feb. 25, 2015

(87) PCT Pub. No.: WO2014/044581
PCT Pub. Date: Mar. 27, 2014

(65) Prior Publication Data
US 2015/0229497 A1    Aug. 13, 2015

(30) Foreign Application Priority Data

Sep. 21, 2012  (EP) .................................... 12306144
Sep. 2, 2013   (EP) .................................... 13368025

(51) Int. Cl.
*H04L 25/03*   (2006.01)
*H03D 3/00*    (2006.01)
(Continued)

(52) U.S. Cl.
CPC .......... *H04L 25/03159* (2013.01); *H03D 3/009* (2013.01); *H04L 27/364* (2013.01); *H04L 27/3863* (2013.01); *H04L 2025/03414* (2013.01)

(58) Field of Classification Search
CPC ... H04L 27/3863; H04L 27/364; H03D 3/009
See application file for complete search history.

(56) References Cited

U.S. PATENT DOCUMENTS

2004/0219884 A1* 11/2004 Mo ........................... H04B 1/30
                                                     455/67.11
2005/0047536 A1*  3/2005 Wu ...................... H04L 27/3863
                                                       375/346

(Continued)

OTHER PUBLICATIONS

International Search Report issued in corresponding International application No. PCT/EP2013/068767, date of mailing of the report Oct. 22, 2013.

(Continued)

*Primary Examiner* — Ross Varndell
(74) *Attorney, Agent, or Firm* — Patent Portfolio Builders PLLC

(57) ABSTRACT

A transceiver for orthogonal frequency division multiplex communication has a transmitter module (1) and a receiver module (2). The transmitter (1) has an l-path (3) and a Q-path (4) to receive signals on a number of subcarriers provided by a signal generator (9). The receiver module (2) has a receiver l-path (7) and a receiver Q-path (8) to deliver signals to a processor (15). IQ imbalance is calculated for each of the transmitter and receiver by the signal generator sending a sample signal (Xl(k), XQ(k)) over a one of the transmitter paths. The signal is then applied to one or each of the inputs to the receiver paths (7,8) to generate receiver output signals Yl(k), YQ(k), RQ(k). The processor (15) is responsive to the output signals to calculate the transmitter and receiver IQ imbalance for that subcarrier. A calibrator (19) and compensator (20) are responsive to the calculated IQ imbalance to correct or compensate each subcarrier of the transceiver band.

13 Claims, 3 Drawing Sheets

(51) Int. Cl.
  *H04L 27/36* (2006.01)
  *H04L 27/38* (2006.01)

(56) References Cited

U.S. PATENT DOCUMENTS

| | | |
|---|---|---|
| 2005/0107059 A1 | 5/2005 | Lehning et al. |
| 2007/0058702 A1 | 3/2007 | Zhang |
| 2009/0028231 A1 | 1/2009 | Lee et al. |
| 2010/0027689 A1 | 2/2010 | Kholmann |
| 2011/0069744 A1 | 3/2011 | Laudel et al. |
| 2011/0069767 A1* | 3/2011 | Zhu .................. H04L 27/368 375/259 |

OTHER PUBLICATIONS

Extended European Search Report issued in corresponding European application No. EP 13 36 8025, date of completion of the search Oct. 15, 2013.

\* cited by examiner

US 9,344,302 B2

LOOPBACK TECHNIQUE FOR IQ IMBALANCE ESTIMATION FOR CALIBRATION IN OFDM SYSTEMS

TECHNICAL FIELD AND PRIOR ART

The invention relates to the field of multicarrier communications systems and more particularly to Orthogonal Frequency-Division Multiplexing (OFDM) systems, including wireless OFDM systems.

Orthogonal Frequency-Division Multiplexing (OFDM), also referred to as "multicarrier modulation" (MCM) or "discrete multi-tone modulation" (DMTM), splits up and encodes high-speed incoming serial data, modulating it over a plurality of different carrier frequencies (called "subcarriers") within a communication channel to transmit the data from one user to another. The serial information is broken up into a plurality of sub-signals that are transmitted simultaneously over the subcarriers in parallel.

By spacing the subcarrier frequencies at intervals of the frequency of the symbols to transmit, the peak power of each modulated subcarrier lines up exactly with zero power components of the other modulated subcarriers, thereby providing orthogonality (independence and separability) of the individual subcarriers. This allows a good spectral efficiency (close to optimal) and minimal inter-channel interference (101), i.e. interferences between the subcarriers.

For these reasons, OFDM is used in many applications. Many digital transmission systems have adopted OFDM as the modulation technique such as digital broadcasting terrestrial TV (DVB-T), digital audio broadcasting (DAB), terrestrial integrated services digital broadcasting (ISDB-T), digital subscriber line (xDSL), WLAN systems, e.g. based on the IEEE 802.11 a/g standards, cable TV systems, etc.

OFDM systems can implement different modulation schemes, like PSK (Phase Shift Keying), BPSK, QPSK, 64-PSK . . . .

One of the main analogue impairments impacting the performance of high order modulation OFDM systems (i.e. like 64-QAM and above) is the quadrature imbalance (called IQ imbalance) on the transmitter and on the receiver. The IQ imbalance causes an image rejection limitation which deteriorates the Error Vector Magnitude (EVM) of the receiver.

The error vector magnitude or EVM (sometimes also called receive constellation error or RCE) is a measure used to quantify the performance of a digital radio transmitter or receiver. A signal sent by an ideal transmitter or received by a receiver would have all constellation points precisely at the ideal locations, however various imperfections in the implementation (such as carrier leakage, low image rejection ratio, phase noise etc.) cause the actual constellation points to deviate from the ideal locations.

An error vector is a vector in the I-Q plane between the ideal constellation point and the point received by the receiver. In other words, it is the difference between actual received symbols and ideal symbols. The average power of the error vector, normalized to signal power, is the EVM. For the percentage format, root mean square (RMS) average is used.

The error vector magnitude is equal to the ratio of the power of the error vector to the root mean square (RMS) power of the reference. It is defined in dB as:

$$EVM(\text{dB}) = 10\log_{(10)}\left(\frac{P_{error}}{P_{reference}}\right)$$

$P_{error}$ is the RMS power of the error vector.

Traditionally, a designer utilizes good design and techniques based on layout matching between the I and Q-paths of the Transmitter and Receiver chains, in order to achieve good IQ imbalance. Newer architectures have been proposed that inherently possess a higher tolerance to quadrature imbalances. At times, the systematic mismatches are characterized in the lab, and a fixed correction is applied in the digital domain in the form of pre- and/or post-distortion coefficients (using a scheme known as a GrammSchmidt orthogonalization method). The problem with this approach is that it cannot take into account process, voltage, and temperature variations. Another disadvantage is that it cannot be applied periodically in-the-field (i.e. during operation of the OFDM system).

Despite all these techniques, IQ imbalance remains one of the main system performance bottlenecks and production yield issues. The most recent developments, however, enable the calibration of IQ imbalances. Many methods have been proposed. Some utilize an entirely analogue approach. However, the most powerful and common technique utilized to combat IQ imbalances in WLAN systems operate a mixed mode (analogue-and-digital) scheme.

According to the experiments of the inventors with this technique, although it guarantees relatively much better calibration performance than all existing techniques, it has two main important disadvantages:

It is based on the image rejection information which is digitized by the ADC in the receiver. But the image rejection information is found at twice the frequency of the LO. It is therefore an out-of-band signal. The bandwidth of the ADC (Analogue to Digital Converter) must therefore be extended so that it can correctly digitize the image information. This implies more complexity and power consumption of the ADC design.

It increases considerably the complexity of the analogue design because it requires the implementation of an RF envelope detector, which itself must be self-testable before being used for IQ imbalance estimation and calibration.

The present invention provides a transceiver adapted to implement a new IQ imbalance estimation technique in order to alleviate at least some of the technical problems experienced with the aforementioned prior art techniques.

STATEMENT OF INVENTION

According to a first aspect of the present invention a transmitter and receiver system for orthogonal frequency division multiplexing communication is arranged to enable a sample signal to be generated and propagated along each transmission path of a transmitter and, from the output of the transmitter path to then be applied to the reception paths of a receiver to generate a received sample signal for one subcarrier, a processor is configured to processes the received signals to calculate the IQ imbalance for the subcarrier.

Accordingly there is provided a transceiver for orthogonal frequency division multiplexing signal transmission and reception comprising:

a transmitter module and a receiver module;

the transmitter module having a transmitter I-path for in phase signals and a transmitter Q-path for quadrature signals;

the receiver module having a receiver I-path for receiving in phase signals and a receiver Q-path for receiving quadrature phase signals;

and characterised by the provision of a loopback system arranged so that:

a. when a first signal (XI(k)) is input to a first of the transmitter paths the first output signal from the first transmitter path (XI(k)') is looped back through the receiver path corresponding to the phase of the first transmitter path and the corresponding output signal (YI(k) recorded, and, b. the first signal output (XI(k)') from the transmitter path is looped back to the input of the receiver path of opposite phase, and the output signal (YQ(k)) of the opposite phase receiver path is recorded, and c. a second signal XQ(k) is applied to the input of the second of the transmission paths and the output of the second transmission path XQ(k)' is looped back to the input of the receiver path of corresponding phase, and the output signal (RQ(k) of the corresponding phase receiver path recorded;

and an IQ imbalance calculator module responsive to the output signals of the receiver paths to calculate the IQ imbalance of the receiver and the IQ imbalance of the transmitter.

According to a second aspect of the present invention there is provided a technique for calculating the IQ imbalance in an orthogonal frequency division multiplexing signal transmission and reception transceiver, said transceiver having a transmitter I-path a transmitter Q-path a receiver I-path and a receiver Q-path and comprising the steps of:

applying a sample signal to a first of the transmission paths to generate a first output signal (XI(k)');

applying the first output signal (XI(k)') to the input of the first receiver path of corresponding phase to generate a first receiver output signal (YI(k);

applying the first output signal (XI(k)' to the input of the second receiver path of opposite phase to generate a second receiver output signal (YQ(k);

applying a second input signal (XQ(k)) to the second transmission path, said second transmission signal being the first transmission signal phase shifted by ninety degrees, applying the output (XQ(k)') generated by the second transmission channel to the input of the second receiver channel to generate a second receiver channel output RQ(k);

calculating the IQ imbalance of the receiver and the IQ imbalance of the transmitter in accordance with the output signals of the receiver paths.

The calculated transmitter and receiver IQ imbalances may then be used to implement IQ calibration. IQ calibration may be achieved by tuning the DC offset and the filter cut-off frequency of a baseband circuit to implement analogue correction.

The calculated transmitter and receiver IQ imbalances can be used to apply compensation to a data signal transmitted in the subcarrier "k". This may be done by either or each of IQ pre-distortion or post-distortion.

The system and method may apply the same IQ imbalance correction and compensation to each subcarrier in the band. However, if the IQ mismatches are caused by the baseband circuitry, a (baseband) frequency-dependent IQ calibration is likely to be required. In this case the IQ imbalance estimation may be applied to several or every frequency of subcarrier. The system and method may then apply correction and compensation to each subcarrier corresponding to the respective estimated IQ imbalances.

BRIEF DESCRIPTION OF THE DRAWINGS

A transceiver for orthogonal frequency division multiplexing signal transmission and reception, and a method of calculating IQ imbalance in such a transceiver will now be described, by way of example only, with reference to the accompanying illustrative figures, in which.

DETAILED DESCRIPTION OF EMBODIMENTS OF THE INVENTION

Figure 1:
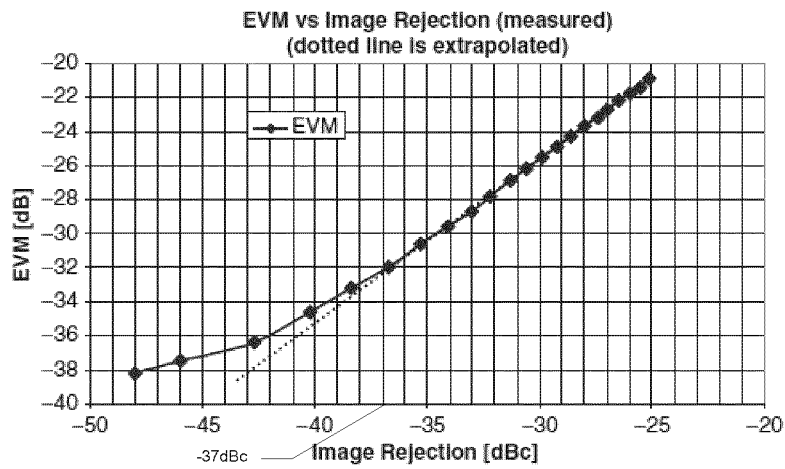
FIG. 1 illustrates the link between the EVM and the image rejection rate.

FIG. 1 illustrates the link between the EVM and the image rejection rate in the example of a 54-Mbps 802.11a based implementation. It shows a measured EVM of "ideal" transmitter as function of its image rejection. The degradation of the EVM at low signal levels is due to the limitations of the VSA (Vector Signal Analyser) at low power levels. The dotted line represents the extrapolated value for an ideal VSA. Channel estimation based on preamble only is used on the VSA for these plots.

In this example, it appears clearly that in order to satisfy the EVM requirements of a 54-Mbps 802.11a signal (EVM=−25 dB), the image rejection of the system is required to be better than approximately −29 dBc.

Figure 2:
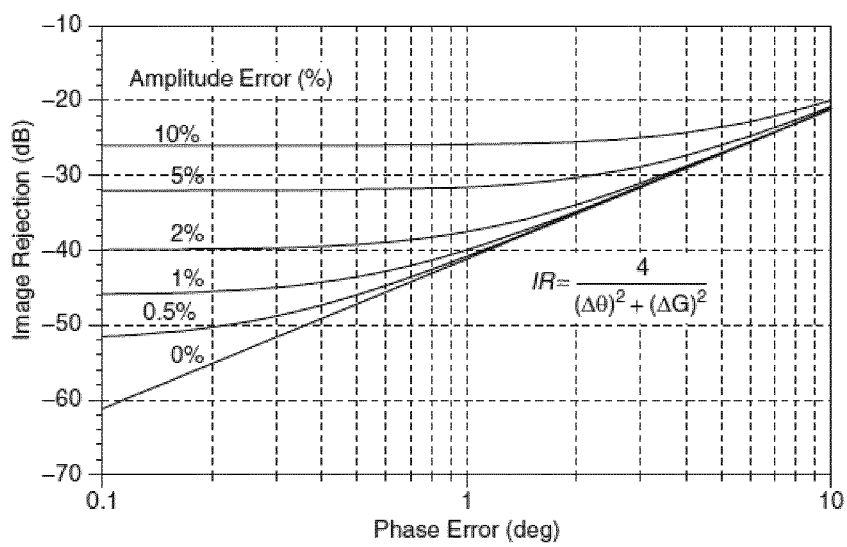
FIG. 2 shows the Relationship between phase error, amplitude error, and image rejection in quadrature modulator/demodulator.

In FIG. 2, it can be seen that in order to achieve such an image rejection, an amplitude error of 5% and phase error of 2% can be tolerated.

We should also note that in this example it is assumed that no other impairments exist in the system. In reality this is never the case, and therefore a system budget is required which determines how much imbalance can be handled in the system in the presence of other impairments. In the case of a transmitter, often the EVM is (and must be) limited by the nonlinearity of the power amplifier. It would therefore be desirable to degrade the EVM due to all other impairments quite minimally. Therefore, a worst-case image rejection of better than −35 dBc is quite desirable.

As explained earlier, achieving an image rejection of about −40 dBc over process, temperature, supply voltage, and channels, especially for the 802.11a standard (which spans 4.9 to 5.8 GHz), is quite challenging and requires a calibration step.

The IQ imbalance is evaluated by the phase imbalance and the amplitude imbalance of the Q-path with respect to the I-path by following equations:

Phase imbalance=phase of the *I*-path signal−phase of the *Q*-path signal+π/2

Figure 3:
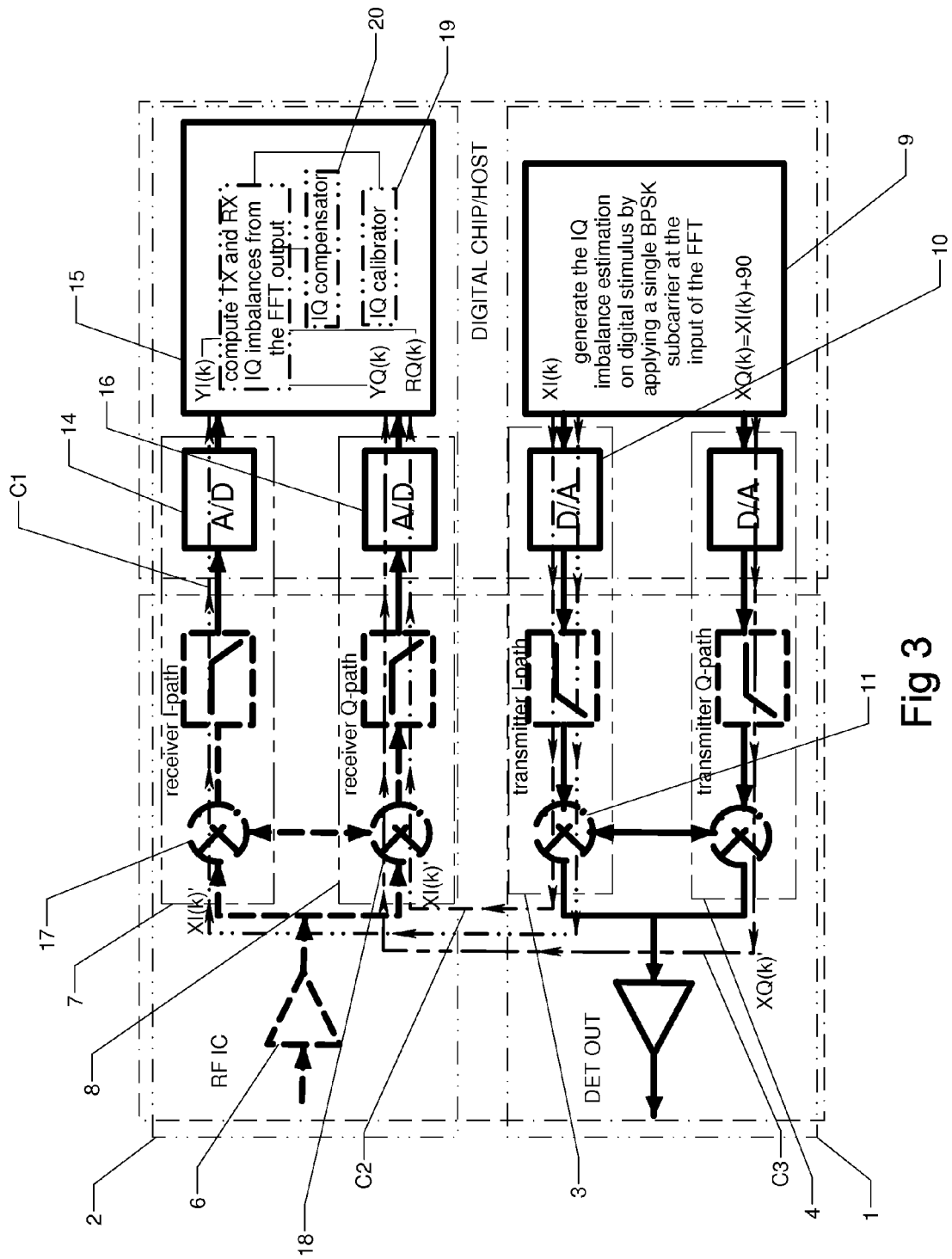
FIG. 3 shows the transceiver analogue and digital block diagram and the 3-loopback scenario for estimating the IQ imbalances of the TX and the RX according to an embodiment of the invention.

Amplitude imbalance=amplitude of the *I*-path signal/amplitude of the *Q*-path signal FIG. 3 shows a transceiver having a transmitter block 1 and a receiver block 2.

The transmitter includes a transmitter I-path 3 and a transmitter Q-path 4. Each transmitter path 3, 4 delivers signal to a transmitter output 5. The receiver block 2 has an input 6 which delivers signal to each of a receiver I-path 7 and a receiver Q-path 8.

A signal generator 9 is capable of generating a BPSK subcarrier signal (XI(k)) and, sequentially, a corresponding signal XQ(k) phase shifted by 90 degrees. The signals from the generator 9 can be applied at input to an Inverse Fast Fourier Transform (IFFT) block.

The transmitter I-path 3 has a digital to analogue converter 10 which delivers the converted signal to a transmitter mixer 11. The signal generator 9 is also arranged to apply the signal to the Q-path 4. Similarly, the transmitter Q-path 4 has a digital to analogue converter 12 delivering converted analogue signal to transmitter mixer 12. The signal output from the transmitter mixers 11 and 12 are delivered to a transmitter output 13.

The receiver I-path 7 is arranged to deliver signal via analogue to digital converter 14 to a signal processor 15. Similarly, the receiver Q-path 8 is arranged to deliver signal via analogue to digital converter 16 to the signal processor 15.

A loopback system of three loopback circuits are added to the OFDM as follows: A first loopback circuit C1 is arranged to take the transmitter I-path output signal (XI(k)') from the output of the transmitter mixer 11 of the transmitter I-path and apply it to the input of the receiver I-path.

A second loopback circuit C2 is arranged to take the transmitter I-path output signal XI(k)' and apply it to the input of the receiver Q-path.

A third loop back circuit C3 is arranged to take the output of the transmitter Q-path 4 and apply it to the input of the receiver Q-path 6.

In an OFDM system, the IQ imbalance estimation technique according to an embodiment of the invention can comprise eight steps. These steps will be now detailed in connection with the FIG. 3. This FIG. 3 shows the transceiver analogue and digital block diagram and the 3-loopback scenario for estimating the IQ imbalances of the transmitter (TX) and the receiver (RX).

1. At the input of the IFFT block in the TX, a single BPSK sample signal XI(k) is generated by the signal generator 9 and sent over a single subcarrier k through the TX chain. Since XI(k) is a BPSK sample, the Q-path of the TX is not active because XI(k) only propagates through the 1-path of the TX. Hereinafter "k" represents the subcarrier index. It means that, in the baseband, the subcarrier frequency is $k \cdot \Delta f$ where $\Delta f$ is the frequency separation between two consecutive subcarriers. $\Delta f = 312.5$ kHz in the standard 802.11a/g.
2. At the output of the transmitter mixer of the I-path, the signal XI(k)' generated by the transmission of XI(k) along the transmitter I-path, is looped back by circuit loopback C1 to the input of a receiver mixer 17 of the I-path 7. At the output of the FFT block in the receiver, the received $k^{th}$ subcarrier is saved as YI(k).
3. At the output of the transmitter mixer of the 1-path, the signal $X_I(k)'$ is looped back to the input of a receiver mixer 18 of the Q-path 8. At the output of the FFT block in the receiver, the received $k^{th}$ subcarrier is saved. Let us name it YQ(k).
4. At this step, the IQ imbalance of the receiver (RX) is estimated according to the following:

RX amplitude error=amplitude(YI(k))/amplitude(YQ(k))

RX phase error=phase(YI(k))−phase(YQ(k))−π/2

At the end of this step, the IQ imbalance of the receiver is estimated. This is started by step 5.
5. Now the receiver is used to estimate the IQ imbalance of the transmitter. At the input of the IFFT block in the transmitter, the sample signal $X_I(k)$ is rotated by +90 degrees to generate a single signal XQ(k) to transmit over the single subcarrier k. The signal is applied to the transmitter module 1 Since XQ(k) is a 90 degrees rotated BPSK sample, the I-path of the transmitter is not active because XQ(k) only propagates through the Q-path of the transmitter.
6. At the output of the transmitter mixer of the Q-path, the signal XQ(k)' formed by propagation of XQ(k) through the transmitter Q-path is looped back to the receiver mixer 18 of the receiver Q-path. At the output of the FFT block in the receiver 2, the received $k^{th}$ subcarrier is saved, as $R_Q(k)$.
7. The IQ imbalance of the transmitter (TX) is estimated according to the following equations:

TX amplitude error=amplitude(YQ(k))/amplitude(RQ(k))

TX phase error=phase(YQ(k))−phase(RQ(k))+π/2
8. The estimated IQ imbalance is then used for one or more of the following actions:
   IQ calibration by tuning the DC offset and the filter cut-off frequency of the baseband circuit. This is called analogue correction in FIG. 4.
   IQ compensation by IQ pre-distortion and/or post-distortion. This is called digital correction in FIG. 4.

Figure 4:
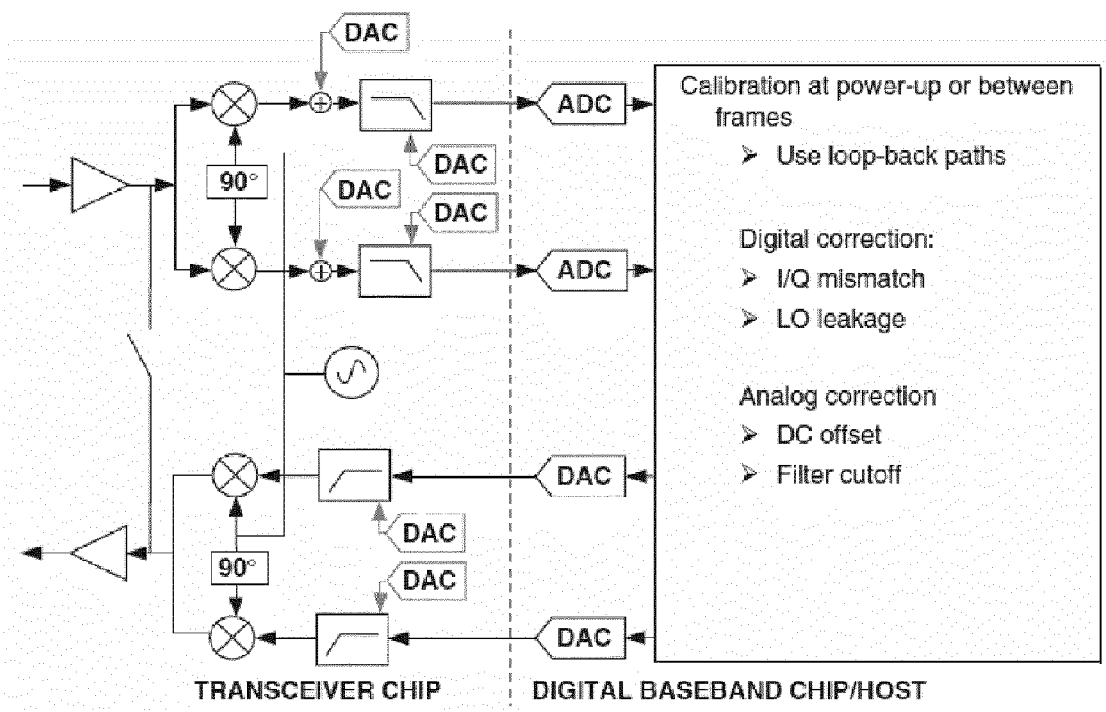
FIG. 4 illustrates an example of 802.11a with IQ imbalance calibration capabilities.

FIG. 4 depicts an example based on 802.11a implementation with IQ imbalance calibration capabilities. The DC-offset and filter cut-off frequency (tuning values in the DACs) are delivered by the calibration routine after estimating the IQ imbalance according to the technique explained previously.

Often the IQ imbalances in a radio are caused by the LO (Local Oscillator) generation circuitry. As such, the IQ imbalances are often constant across the bandwidth of the OFDM signal and a fixed pre- or post-distortion phase and amplitude correction terms are sufficient to calibrate the system. In this usual case, a single BPSK subcarrier is sufficient to estimate the IQ imbalance for all subcarriers.

However, if the IQ mismatches are caused by the baseband circuitry, a (baseband) frequency-dependent IQ calibration is likely to be required. The estimation technique presented in this previously described technique, however, is still applicable, but multiple BPSK subcarriers at different baseband frequencies (different k values), however, may be required; i.e. the 8 steps have to be repeated for different k values.

For the WLAN transceiver of our case-study, we found by simulation that 3 different values of k (evenly distributed over the OFDM signal band) are sufficient.

If we take the standard 802.11 a/g, the OFDM signal band is 52*312. 5 MHz=16. 25 MHz where 52 is the number of subcarriers. Subcarriers with indices 15, −2, and −19 are the 3 evenly distributed BPSK subcarriers that we chose to estimate the IQ imbalance when it is not constant over all the bandwidth of the OFDM signal.

The invention has been described with reference to preferred embodiments; but other embodiments and variations are possible while being within the scope of the claimed invention.

Our estimation technique has many advantages over the existing ones in terms of precision, implementation, re-usability of the available resources, and power consumption.

Using our technique, the IQ imbalances of both the TX and RX are estimated on-chip and in-the-field (i.e. during operation). The estimation results are used as inputs to a calibrator 19 wherein a calibration algorithm acts to tune the circuit and attain minimum IQ imbalance. The estimation results are also fed to the digital and/or analogue compensator 20 to compensate for the IQ imbalance for better detection. The IQ imbalance calibration algorithm and tuning and compensation are well-known in the art.

No extra analogue or digital hardware is needed which is a major advantage versus the current techniques.

The technique can be generalized to any transceiver design based on I and Q-paths in the TX and RX.

The invention claimed is:

1. A transceiver for orthogonal frequency division multiplexing signal transmission and reception comprising:
    a transmitter having a first and second transmitter path providing respectively a transmitter I-path for in-phase-signals and a transmitter Q-path for quadrature signals;
    a receiver having a first and a second receiver path providing respectively a receiver I-path for receiving in-phase-signals and a receiver Q-path for receiving quadrature phase signals;
    a loopback system, which comprises
        a first loopback circuit, whereby a first generated signal is propagated through the first transmitter path to generate a first output signal and where the first output signal from the first transmitter path is looped back through the receiver path corresponding to the phase of the first transmitter path to generate a first receiver output signal;
        a second loopback circuit, whereby the first output signal from the first transmitter path is looped back through the receiver path of opposite phase to generate a second receiver output signal; and
        a third loopback circuit, whereby when a second signal is applied to the input of the second transmission path, the output of the second transmission path is looped back through the receiver path of corresponding phase to generate a third receiver output signal;
    a processor that is arranged to receive the first, second, and third receiver output signals and to calculate an IQ imbalance of each of the transmitter and receiver in order to implement IQ imbalance correction or compensation.

2. The transceiver according to claim 1, wherein the processor includes a calibrator responsive to the calculated IQ imbalance to implement analogue correction of the subcarrier.

3. The transceiver according to claim 2, wherein the calibrator implements calibration by tuning the DC offset and the filter cut-off frequency of a baseband circuit to implement analogue correction in accordance with the IQ imbalance.

4. The transceiver according to claim 2, wherein the processor is responsive to the IQ imbalance to apply the same correction or compensation to each subcarrier in the transceiver band.

5. The transceiver according to claim 2, wherein the signal generator is arranged to apply a sample signal to each subcarrier in order to calculate an IQ imbalance for each subcarrier.

6. The transceiver according to claim 5, wherein the calibrator applies a calibration correction to each sub carrier according to the corresponding calculated IQ imbalance.

7. The transceiver according to claim 5, wherein the compensator is responsive to each calculated IQ imbalance to apply a corresponding compensation to the respective sub carrier.

8. The transceiver according to claim 1, including a compensator responsive to the calculated IQ imbalance to apply compensation to a data signal transmitted on the subcarrier.

9. A method for calculating the IQ imbalance in an orthogonal frequency division multiplexing signal transmission and reception transceiver, said transceiver having a transmitter with first and second transmitter paths providing respectively a transmitter I-path for in-phase signals and a transmitter Q-path for quadrature signals, and a receiver having first and second receiver paths receiving in-phase and quadrature phase signals, the method comprising the steps of:
    applying a sample signal to the first transmitter path to generate a first output signal;
    applying, via a first loopback circuit, the first output signal to an input of the first receiver path of corresponding phase of the first transmitter path to generate a first receiver output signal;
    applying, via a second loopback circuit, the first output signal to an input of the second receiver path of opposite phase to the first transmitter path to generate a second receiver output signal;
    applying a second input signal to the second transmitter path to generate a second output signal, said second output signal being the first output signal phase shifted by ninety degrees,
    applying, via a third loopback circuit, the output generated by the second transmission path to an input of the second receiver path of corresponding phase of the second transmitter path to generate a third receiver output signal; and
    calculating an IQ imbalance of the receiver and an IQ imbalance of the transmitter in accordance with the first, second, and third receiver output signals.

10. The method according to claim 9, including the step of calibrating the subcarrier in response to the calculated IQ imbalance to implement analogue correction of the imbalance.

11. The method according to claim 10, wherein the same correction or compensation is applied to each subcarrier.

12. The method according to claim 9, further comprising compensating a data signal sent over the subcarrier in accordance with the IQ imbalance.

13. The method according to claim 9, wherein a sample signal is applied to each carrier to calculate an IQ imbalance for each subcarrier, and correction or compensation according to each subcarrier IQ imbalance is applied to respective subcarrier.

* * * * *